(12) United States Patent
Nagata et al.

(10) Patent No.: US 7,847,295 B2
(45) Date of Patent: Dec. 7, 2010

(54) THIN FILM TRANSISTOR, DISPLAY DEVICE USING THEREOF AND METHOD OF MANUFACTURING THE THIN FILM TRANSISTOR AND THE DISPLAY DEVICE

(75) Inventors: Hitoshi Nagata, Tokyo (JP); Naoki Nakagawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 66 days.

(21) Appl. No.: 12/026,794

(22) Filed: Feb. 6, 2008

(65) Prior Publication Data

US 2008/0224147 A1      Sep. 18, 2008

(30) Foreign Application Priority Data

Mar. 15, 2007      (JP) ............................. 2007-066718

(51) Int. Cl.
  *H01L 27/14* (2006.01)
(52) U.S. Cl. ............................. 257/72; 257/59; 257/258; 257/E51.005
(58) Field of Classification Search .................. 257/59, 257/72, 258, E51.005
  See application file for complete search history.

(56) References Cited

U.S. PATENT DOCUMENTS

| | | | |
|---|---|---|---|
| 5,162,892 A | 11/1992 | Hayashi et al. | |
| 5,962,896 A | 10/1999 | Yabuta et al. | |
| 6,150,692 A | 11/2000 | Iwanaga et al. | |
| 6,271,540 B1 | 8/2001 | Miyamoto et al. | |
| 6,891,236 B1 | 5/2005 | Yamazaki | |
| 7,221,039 B2 | 5/2007 | Huang et al. | |
| 2004/0209389 A1 | 10/2004 | Liang | |
| 2007/0019032 A1* | 1/2007 | Maekawa et al. | ............. 347/45 |
| 2007/0257606 A1* | 11/2007 | Winters et al. | ............. 313/505 |

FOREIGN PATENT DOCUMENTS

CN          1713398 A          12/2005

(Continued)

OTHER PUBLICATIONS

Toshiyuki Sameshima, et al., "Heat Treatment of Amorphous and Polycrystalline Silicon Thin Films with $H_2O$ Vapor", Japanese Journal of Applied Physics, vol. 37, Part 2, No. 2A, Feb. 1, 1998, pp. L 112-L 114.

(Continued)

*Primary Examiner*—Tan N Tran
(74) *Attorney, Agent, or Firm*—Oblon, Spivak, McClelland, Maier & Neustadt, L.L.P.

(57) ABSTRACT

A thin film transistor includes a gate electrode, a gate insulating film formed to cover the gate electrode, a semiconductor layer including a channel region formed over the gate electrode, a source electrode and a drain electrode including a region connected to the semiconductor layer, where at least a part of the region is overlapped with the gate electrode, an upper insulating film formed to cover the semiconductor layer, the source electrode and the drain electrode, where the upper insulating film is directly in contact with the channel region of the semiconductor layer and discharges moisture by a heat treatment and a second upper insulating film formed to cover the first protective film and suppress moisture outdiffusion.

7 Claims, 7 Drawing Sheets

FOREIGN PATENT DOCUMENTS

| | | |
|---|---|---|
| JP | 60-136259 | 7/1985 |
| JP | 61-46069 | 3/1986 |
| JP | 5-343534 | 12/1993 |
| JP | 7-78997 | 3/1995 |
| JP | 8-51156 | 2/1996 |
| JP | 8-172202 | 7/1996 |
| JP | 9-298303 | 11/1997 |
| JP | 11-330472 | 11/1999 |
| JP | 2004-363626 | 12/2004 |
| KR | 20030057408 A | 7/2003 |

OTHER PUBLICATIONS

Toshiyuki Sameshima, et al., "Improvement in Characteristics of Polycrystalline Silicon Thin-Film Transistors by Heating with High-Pressure $H_2O$ Vapor", Japanese Journal of Applied Physics, vol. 37, Part 2, No. 9A/B, Sep. 15, 1998, pp. L 1030-L 1032.

Keiji Sakamoto, et al., "Passivation of $SiO_2$/Si Interfaces Using High-Pressure-$H_2O$-Vapor Heating", The Japan Society of Applied Physics, vol. 39, Part 1, No. 5A, May 2000, pp. 2492-2496.

Norio Hirashita, et al., "Thermal Desorption and Infrared Studies of Plasma-Enhanced Chemical Vapor Deposited SiO Films with Tetraethylorthosilicate", Japanese Journal of Applied Physics, vol. 32, Part 1, No. 4, Apr. 1993, pp. 1787-1793.

U.S. Appl. No. 08/992,099, filed Dec. 17, 1997, Sakata, et al.

\* cited by examiner

THIN FILM TRANSISTOR, DISPLAY DEVICE USING THEREOF AND METHOD OF MANUFACTURING THE THIN FILM TRANSISTOR AND THE DISPLAY DEVICE

BACKGROUND OF THE INVENTION

1. Field of the Invention

The present invention relates to a thin film transistor, a display device using thereof and a method of manufacturing the thin film transistor and the display device.

2. Description of Related Art

Thin film transistors (TFT) are widely used as a transistor for driving pixels in an active matrix liquid crystal display device (AMLCD). Especially an amorphous silicon (a-Si) TFT using an amorphous silicon (Si) film as a semiconductor film of a TFT only requires a few number of manufacturing processes and is easy to increase glass substrate size, thereby achieving high productivity. Therefore, a-Si TFT is the mainstream of TFTs for the present AMLCD. Furthermore, there is an increasing tendency of simplifying panel parts of AMLCD to improve reliability by using a-Si TFT to the peripheral circuit device for driving AMLCD. Moreover, commercial production is proceeding for a-Si TFT AMOLED which uses a-Si TFT for the pixel driving circuit device of an active matrix organic EL display device (AMOLED) in which polycrystalline silicon (p-Si) TFT is mainly used in related art. This realizes a cheap and wide area AMOLED.

In order to further simplify the manufacturing process and improve productivity, an inverted staggered type channel etch (CE) structure is mainly used for a-Si TFT. In the inverted staggered type, a gate electrode is formed over an insulating substrate and a gate insulating film is formed to cover the gate electrode. A silicon film having a source/drain region and a channel region is opposed to the gate electrode with the gate insulating film interposed therebetween over the gate electrode. Moreover, conductive impurities are included in the silicon film and this conductive impurity concentration becomes maximum at the side far from the gate electrode. As The CE structure, a channel region is formed in the manufacturing process by etching to remove the conductive impurity layer formed to the back channel side of the silicon film.

The a-Si TFT with the inverted staggered CE structure has a serious shortcoming if used as a peripheral circuit device for driving AMLCD or a pixel driving circuit device of AMOLED. The shortcoming is that the driving performance of TFT is low and drain current at ON state is not enough to be used as a circuit device. Usually, this shortcoming is made up by increasing a channel width of a TFT, however such expansion in occupation area of a TFT is an interference to higher resolution of AMLCD and AMOLED.

The key factor to low on current of the inverted staggered CE structure a-Si TFT is its low carrier mobility ($\mu$eff). In the inverted staggered type a-Si TFT, generally $\mu$eff is larger for etch stopper (ES) structure a-Si TFT than CE structure a-Si TFT. However, the inverted staggered ES structure TFT additionally requires photolithography for ES, thus the productivity is low.

As mentioned above, in the manufacturing process of the inverted staggered CE structure TFT, a channel region is formed by etching to remove the conductive impurity layer formed to the back channel side of the silicon film. This exposes the back channel side to the surface and the back channel side is exposed to plasma etching and heat treatment. Therefore, with the inverted staggered CE structure TFT, dangling bond in silicon increases during these processes, thereby leading to deterioration of $\mu$eff. A dangling bond means the bonding hand occupied by an electron (unpaired electron) which loses the partner of covalent bond and does not participate in bonding. Accordingly, electrons in dangling bond are unstable. In Japanese Unexamined Patent Application Publications No. 60-136259, 61-46069 and 7-78997, the technique is disclosed to reconstruct a dangling bond generated in silicon by hydrotreating. Moreover, in Japanese Unexamined Patent Application Publication No. 2004-363626, the technique is disclosed to reconstruct a dangling bond generated in silicon by hydrotreating in LTPS-TFT (low-temperature p-Si TFT). Furthermore, Japanese Unexamined Patent Application Publication No. 60-136259, 61-46069, 7-78997 and 2004-363626 are related to a planer type TFT.

For a p-Si TFT, a silicon oxide film is usually used as an insulating film. Especially for a gate insulating film, a silicon oxide film is used, which is formed by Plasma Enhanced Chemical Vapor Deposition (CVD) with TEOS (Tetra Ethyl Ortho Silicate) having high hydrogen concentration as material gas. By covering the silicon oxide film with a cap film such as a silicon nitride film and applying a heat treatment, hydrogen is sufficiently diffused under the cap film and the dangling bond in the silicon is reconstructed.

On the other hand, in Jpn. J. Appl. Phys., Vol. 37 (1998) pp. L112-L114 (T. Sameshima, M. Satoh, K. Sakamoto, A. Hisamatsu, K. Ozaki and K. Saitoh), Jpn. J. Appl. Phys., Vol. 37 (1998) pp. L1030-L1032 (T. Sameshima, M. Satoh, K. Sakamoto, K. Ozaki and K. Saitoh) and Jpn. J. Appl. Phys., Vol. 39 (2000) pp. 2492-2496 (K. Sakamoto and T. Sameshima), dangling bond in a silicon film, a silicon oxide film and an interface between the silicon film and the silicon oxide film is improved in low-temperature (300 to 350 degrees Celsius) annealing in water vapor atmosphere. Jpn. J. Appl. Phys., Vol. 37 (1998) pp. L112-L114 (T. Sameshima, M. Satoh, K. Sakamoto, A. Hisamatsu, K. Ozaki and K. Saitoh) discloses that the dark conductivity of a-Si and low-temperature p-Si decreases and photoconductivity of them increases by low-temperature (350 degrees Celsius) heat treatment in water vapor atmosphere. Jpn. J. Appl. Phys., Vol. 37 (1998) pp. L1030-L1032 (T. Sameshima, M. Satoh, K. Sakamoto, K. Ozaki and K. Saitoh) discloses that $\mu$eff of low-temperature p-Si TFT increases and threshold current decreases by high pressure water vapor annealing and atmospheric pressure vapor annealing. Jpn. J. Appl. Phys., Vol. 39 (2000) pp. 2492-2496 (K. Sakamoto and T. Sameshima) discloses that the trap level density of an interface between a silicon film and a silicon oxide film is improved by high pressure water vapor annealing and Si—O bond increases. Moreover, it also discloses that the dangling bond density which is the main factor of the trap level decreases and Si—O bond increases in low-temperature annealing in water vapor atmosphere. Jpn. J. Appl. Phys., Vol. 37 (1998) pp. L112-L114 (T. Sameshima, M. Satoh, K. Sakamoto, A. Hisamatsu, K. Ozaki and K. Saitoh), Jpn. J. Appl. Phys., Vol. 37 (1998) pp. L1030-L1032 (T. Sameshima, M. Satoh, K. Sakamoto, K. Ozaki and K. Saitoh) and Jpn. J. Appl. Phys., Vol. 39 (2000) pp. 2492-2496 (K. Sakamoto and T. Sameshima) suggest that not only hydrogen but moisture contributes greatly to the improvement of dangling bond in a silicon film, a silicon oxide film and an interface between the silicon film and the silicon oxide film, which has been explained in related art.

Moreover, silicon oxide films not only dilute hydrogen from a nitride film but there are silicon oxide films which discharge moisture at the time of annealing. According to Jpn. J. Appl. Phys., Vol. 32 (1993) pp. 1787-1793 (N. Hirashita, S. Tokitoh and H. Uchida), there are three-stage moisture discharge temperature by TDS (Thermal Desorption Mass Spectroscopy) measurement of a silicon oxide film using TEOS as material gas. The first stage is 100 to 200 degrees Celsius, the second stage is 150 to 300 degrees Celsius and the third stage is 350 to 650 degrees Celsius. The moisture discharge in the first and the second stages is by absorbed water in a silicon oxide film using TEOS as material gas. Then the moisture discharge in the third stage is said to be moisture discharge by Si—OH (Jpn. J. Appl. Phys., Vol. 32 (1993) pp. 1787-1793 (N. Hirashita, S. Tokitoh and H. Uchida)).

Usually, in the manufacturing process of the inverted staggered CE structure a-Si TFT, a silicon nitride film is mostly used as an insulating film. When forming a silicon nitride film by plasma CVD, hydrogen plasma occurs at the time of plasma CVD and hydrogen can be introduced. However, the hydrogen amount generated at the time of plasma CVD is not enough to reconstruct a dangling bond in silicon.

There are few examples of an oxide film in a silicon interface in the inverted staggered CE structure TFT of related art. The oxide film over the silicon surface in Japanese Unexamined Patent Application Publication No. 8-172202 is an oxygen plasma oxide film used as a stopper for etching when etching to remove the conductive impurity layer in the manufacturing process of the inverted staggered CE structure TFT. This oxygen plasma oxide film cannot reconstruct the dangling bond in silicon sufficiently.

Japanese Unexamined Patent Application Publications No. 9-298303 and 11-330472 relate to the inverted staggered type ES structure TFT. The silicon oxide film here is used for reducing level density in the interface between the silicon nitride film and the silicon film and the silicon oxide film is not used to reconstruct the dangling bond in silicon. Accordingly, the improvement effect of $\mu$eff is low.

SUMMARY OF THE INVENTION

The present invention is made to solve the above problems and aims to provide a thin film transistor with good TFT characteristics, a display device using thereof and a manufacturing method of the thin film transistor and the display device.

According to an aspect of the present invention, there is provided a thin film transistor that includes a gate electrode, a gate insulating film formed to cover the gate electrode, a semiconductor layer formed over the gate electrode with the gate insulating film interposed therebetween, where the semiconductor layer includes a channel region, a source electrode and a drain electrode including a region connected to the semiconductor layer, where at least a part of the region is overlapped with the gate electrode, a first protective film formed to cover the semiconductor layer, the source electrode and the drain electrode, where the first protective film is directly in contact with the channel region of the semiconductor layer and discharges moisture by a heat treatment and a second protective film formed to cover the first protective film and suppress moisture out-diffusion.

According to another aspect of the present invention, there is provided a method of manufacturing a thin film transistor that includes forming a gate electrode over a substrate, forming a gate insulating film over the gate electrode, forming a semiconductor layer including a channel region over the gate electrode with the gate insulating film interposed therebetween, forming a source electrode and a drain electrode over the semiconductor layer, forming a first protective film to cover the semiconductor layer, the source electrode and the drain electrode and to be directly in contact with the channel region of the semiconductor layer, where the first protective film discharges moisture by a heat treatment, forming a second protective film to cover the first protective film, where the second protective film suppresses moisture out-diffusion and diffusing moisture in the first protective film covered by the second protective film by a heat treatment.

The present invention provides a thin film transistor with good TFT properties, a display device using thereof and a manufacturing method of the thin film transistor and the display device.

The above and other objects, features and advantages of the present invention will become more fully understood from the detailed description given hereinbelow and the accompanying drawings which are given by way of illustration only, and thus are not to be considered as limiting the present invention.

DESCRIPTION OF THE PREFERRED EMBODIMENTS

Figure 1:
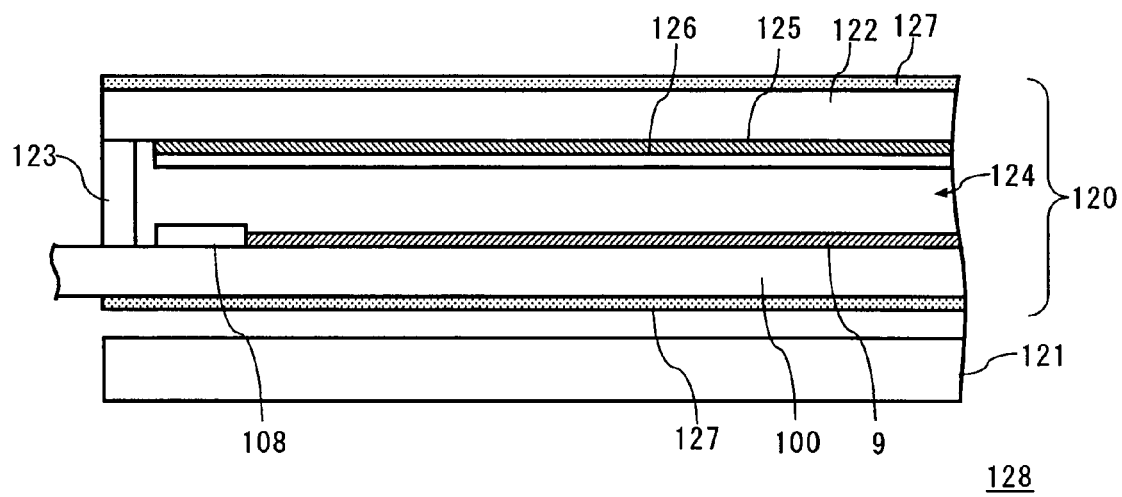
FIG. 1 is a schematic cross-sectional diagram showing the configuration of a liquid crystal display device.

Firstly, a display device is explained with reference to FIG. 1. A TFT array substrate 100 described later is used for the display device. Display devices are for example flat panel display devices such as a liquid crystal display device and an EL display device. Moreover, for the EL display device, there are an organic EL display device and an inorganic EL display device. Here, a transmissive liquid crystal display device is explained as an example. FIG. 1 is a schematic cross-sectional diagram showing the configuration of a liquid crystal display device 128.

The liquid crystal display device 128 includes a liquid crystal panel 120, a backlight unit 121 and a driving circuit (not shown), etc. The liquid crystal panel 120 is formed by bonding a TFT array substrate 100 and an opposing substrate 122 which is disposed opposite to the TFT array substrate 100 using a sealing agent 123 in the periphery and forming a liquid crystal layer 124 between the TFT array substrate 100 and the opposing substrate 122 and then sealing it. The TFT array substrate 100 includes a thin film transistor (TFT) 108 as a switching device. Then, a pixel electrode 9 is disposed for every pixel in the region surrounded by the sealing agent 123. The backlight unit 121 is disposed to the opposite side to the display screen of the liquid crystal panel 120 and irradiates with light from the back side of the liquid crystal panel 120. Then, a driving circuit (not shown) is provided in the edge portion of the TFT array substrate 100. Accordingly, various external signals are supplied. ON/OFF of the TFT 108 are controlled according to those signals. When the TFT 108 is in ON state, a display voltage is applied to the pixel electrode 9.

The opposing substrate 122 includes a color filter layer 125 and an opposing electrode 126. The color filter layer 125 includes a black-matrix (BM) layer and colored layers of red (R) green (G) blue (B). The opposing electrode 126 is disposed to the liquid crystal layer 124 side of the opposing substrate 122 and provides a common potential for supplying a signal potential to the liquid crystal layer 124. Note that if used for an IPS liquid crystal display device for example, the opposing electrode 126 is disposed to the TFT array substrate 100 side. Then, the color filter layer 125 is formed in the region between the opposing substrate 122 and the opposing electrode 126 which is opposite to the pixel electrode 9 and the TFT 108. Colors are displayed using this color filter layer 125.

Moreover, a liquid crystal alignment layer (not shown) for aligning the liquid crystal is formed to the surface by the side of the liquid crystal layer 124 of the TFT array substrate 100 and the opposing substrate 122. Then, a polarizing plate 127 is attached respectively to outside of the TFT array substrate 100 and the opposing substrate 122 and the liquid crystal panel 120 is formed. The liquid crystal display device 128 is formed as mentioned above. Moreover, the abovementioned configuration is an example and the configuration of those other than this may be used.

The liquid crystal is driven by an electric field between the pixel electrode 9 and the opposing electrode 126. Thus, an alignment direction of the liquid crystal between the substrates is changed. As a result, a polarized state of light transmitted through the liquid crystal layer 124 is changed. That is, a polarized state of the light that was turned into linearly-polarized light through the polarizing plate 127 is changed by the liquid crystal layer 124. More specifically, light from the backlight unit 121 and external light are turned into linearly-polarized light by the polarizing plate 127. Then, a polarized state is changed by the linearly-polarized light passing through the liquid crystal layer 124.

Accordingly, an amount of light transmitted through the polarizing plate 127 on the opposing substrate 122 side is changed in accordance with the polarized state. That is, an amount of light transmitted through the polarizing plate 127 on the display screen side out of the light emitted from the backlight unit 121 and transmitted through the liquid crystal panel 120 is changed. The alignment direction of liquid crystal is changed in accordance with the applied display voltage. Hence, the display voltage is controlled to thereby change an amount of light transmitted through the polarizing plate 127 on the display screen side. That is, different display voltages are applied to the pixels to thereby display a desired image.

Figure 2:
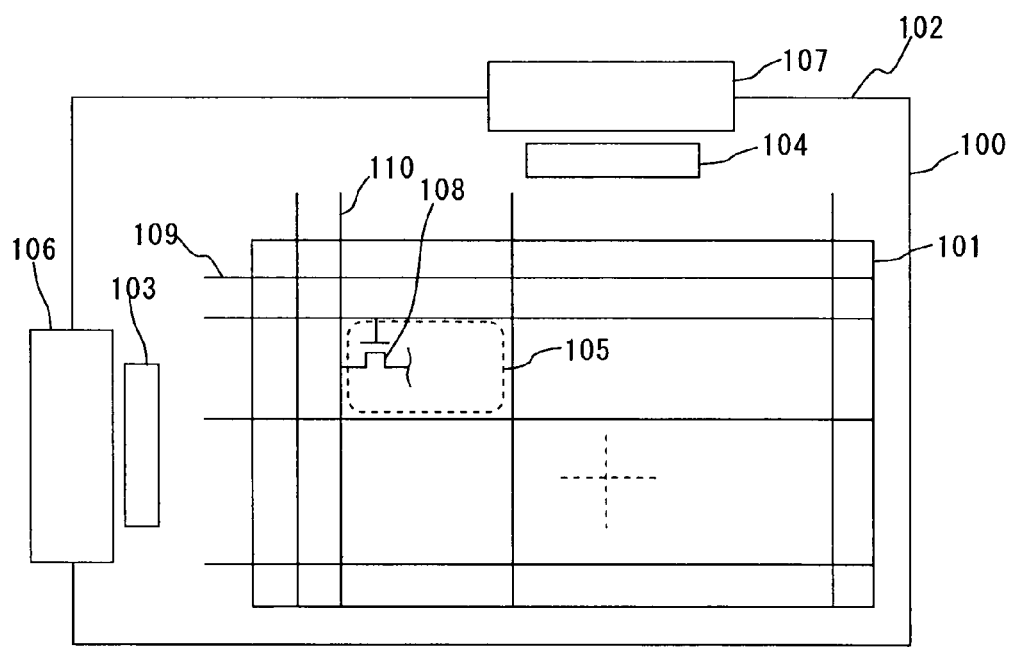
FIG. 2 is a plan schematic view showing the configuration of a TFT array substrate.

Next, the TFT array substrate 100 used for the abovementioned liquid crystal display device 128 is explained with reference to FIG. 2. FIG. 2 is a plan schematic view showing the configuration of the TFT array substrate 100. The TFT 108 is used for the TFT array substrate 100 as a switching device as mentioned above.

The TFT array substrate 100 has a display region 101 and a frame region 102 surrounding the display region 101. In the display region 101, plural gate signal lines (scanning signal line) 109 and plural source signal lines (display signal lines) 110 are formed. The plural gate signal lines 109 are arranged in parallel. Likewise, the plural source signal lines 110 are arranged in parallel. The gate signal lines 109 and the source signal lines 110 cross each other. The gate signal lines 109 and the source signal lines 110 are orthogonal to each other. A region surrounded adjacent the gate signal lines 109 and adjacent the source signal lines 110 is a pixel 105. Thus, the pixels 105 are arranged in matrix in the TFT array substrate 100.

Further, the frame region 102 of the TFT array substrate 100 includes a scanning signal driving circuit 103 and a display signal driving circuit 104. The gate signal line 109 extends from the display region 101 to the frame region 102. Then, the gate signal line 109 is connected with the scanning signal driving circuit 103 at the end of the TFT array substrate 100. The source signal line 110 similarly extends from the display region 101 to the frame region 102. Then, the source signal line 110 is connected to the display signal driving circuit 104 at the end of the TFT array substrate 100. An external line 106 is connected near the scanning signal driving circuit 103. Further, an external line 107 is connected near the display signal driving circuit 104. The external lines 106 and 107 are constituted, for example, by a wiring board such as an FPC (Flexible Printed Circuit).

Various signals are externally supplied to the scanning signal driving circuit 103 and the display signal driving circuit 104 through the external lines 106 and 107. The scanning signal driving circuit 103 supplies a gate signal (scanning signal) to the gate signal line 109 in accordance with an external control signal. The gate signal lines 109 are successively selected in accordance with the gate signal. The display signal driving circuit 104 supplies a display signal (display voltage) to the source signal lines 110 in accordance with the external control signal or display data. As a result, a display voltage corresponding to the display data can be applied to each pixel 105. Incidentally, the scanning signal driving circuit 103 and the display signal driving circuit 104 are not limited to the above configuration where the circuits are formed over the TFT array substrate 100. For example, a driving circuit may be connected by a TCP (Tape Carrier Package).

In each pixel 105, at least one TFT 108 is formed. The TFT 108 is formed in the vicinity of an intersection of the source signal line 110 and the gate signal line 109. For example, the TFT 108 supplies a display voltage to the pixel electrode 9. The gate electrode of the TFT 108 as a switching device is connected to the gate signal line 109, and the TFT 108 is turned ON/OFF under control in accordance with a signal input from a gate terminal. The source electrode of the TFT 108 is connected to the source signal line 110. If a voltage is applied to the gate electrode, a current flows from the source signal line 110. As a result, a display voltage is applied to the pixel electrode 9 connected to the drain electrode of the TFT 108 from the source signal line 110. Then, an electric field corresponding to the display voltage is generated between the pixel electrode 9 and the opposing electrode 126.

First Embodiment

Figure 3:
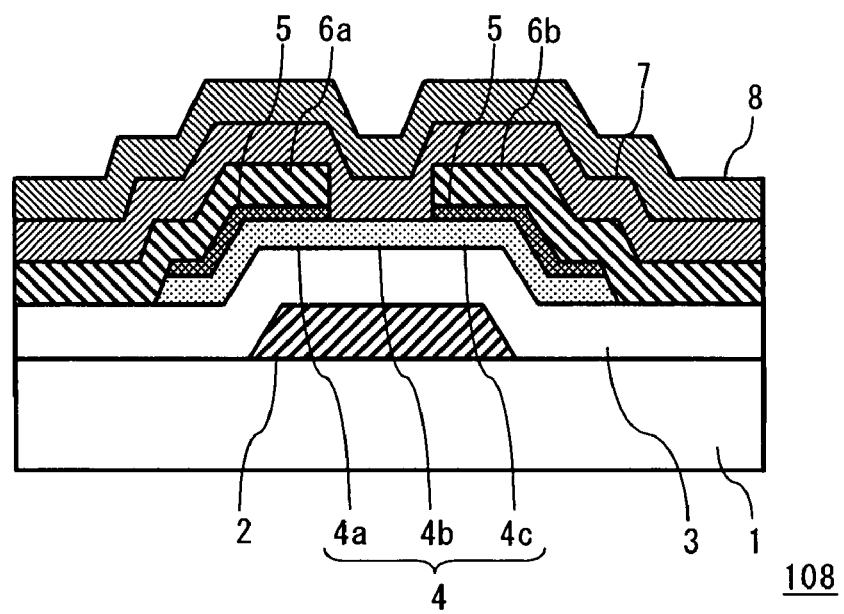
FIG. 3 is a schematic cross-sectional diagram showing the configuration of a TFT according to a first embodiment.
Figure 4:
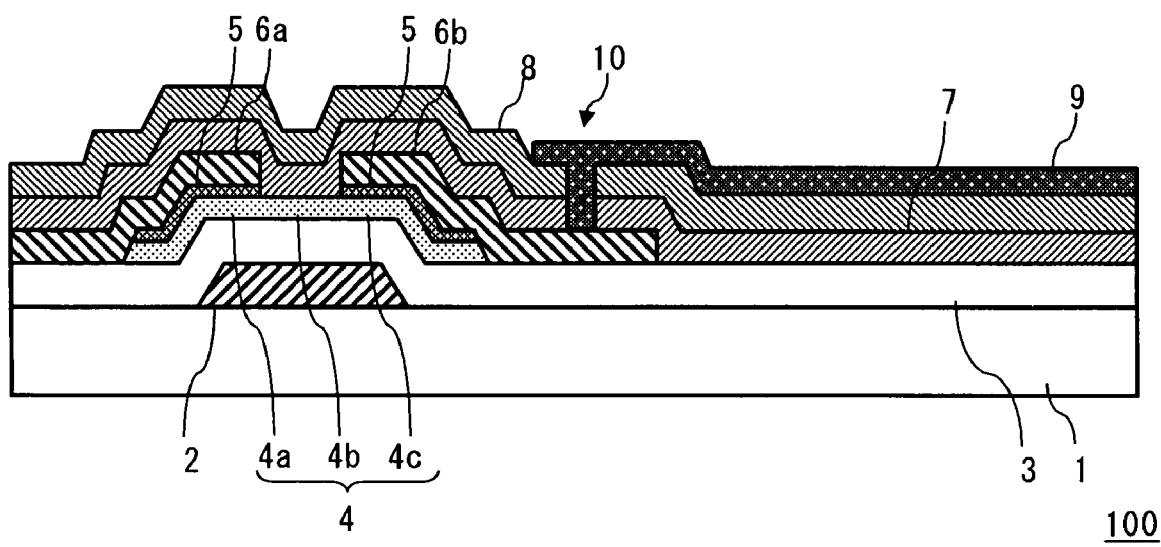
FIG. 4 is a schematic cross-sectional diagram showing the configuration of a TFT array substrate at one pixel according to the first embodiment.

A TFT according to this embodiment is explained with reference to FIGS. 3 and 4. FIG. 3 is a schematic cross-sectional diagram showing the configuration of the TFT 108. FIG. 4 is a schematic cross-sectional diagram showing the configuration of the TFT array substrate 100 at one pixel. Note that the same numbers represent the same layer in the drawings. Hereafter, a channel etch (CE) type TFT with inverted staggered structure is explained as an example of the TFT 108.

A gate electrode 2 is formed over an insulating substrate 1. As the insulating substrate 1, a transparent insulating substrate such as a glass and a quartz substrate can be used. Then, a gate insulating film 3 is formed to cover the gate electrode 2. Next, a semiconductor film 4 is formed over the gate electrode 2 with the gate insulating film 3 interposed therebetween. That is, the semiconductor film 4 is formed over the gate insulating film 3 and is overlapped with the gate electrode 2 with the gate insulating film 3 interposed therebetween. Moreover, a conductive impurity semiconductor film 5 doped with conductive impurities is formed to the both ends over the semiconductor film 4. That is, a semiconductor layer in this embodiment includes the semiconductor film 4 and a conductive impurity semiconductor film 5. Then, the region of the semiconductor film 4 corresponding to the conductive impurity semiconductor film 5 is to be a source/drain region. Specifically, the region of the semiconductor film 4 corresponding to the conductive impurity semiconductor film 5 of the left-hand side in FIG. 3 is a source region 4a. Furthermore, the region of the semiconductor film 4 corresponding to the conductive impurity semiconductor film 5 of the right-hand side in FIG. 3 is a drain region 4c. Accordingly, the source/drain region is formed to the both ends of the semiconductor film 4. Further, the region between the source/drain region of the semiconductor film 4 is a channel region 4b. Moreover, the conductive impurity semiconductor film 5 is not formed over the channel region 4b.

Then, a source electrode 6a and a drain electrode 6b are formed over the conductive impurity semiconductor film 5. More specifically, the source electrode 6a is formed over the conductive impurity semiconductor film 5 by the side of the source region 4a. Furthermore, the drain electrode 6b is formed over the conductive impurity semiconductor film 5 by the side of the drain region 4c. Moreover, the source electrode 6a and the drain electrode 6b are formed wider towards the outside of the channel region 4b than the conductive impurity semiconductor film 5. That is, over the channel region 4b, the source electrode 6a and the drain electrode 6b are not formed as with the conductive impurity semiconductor film 5. Moreover, the source electrode 6a and the drain electrode 6b are formed over the gate electrode 2 with the gate insulating film 3 or the like interposed therebetween. That is, the source electrode 6a and the drain electrode 6b are overlapped with at least a part of the gate electrodes 2 with the gate insulating film 3 or the like interposed therebetween. In other words, in the source electrode 6a and the drain electrode 6b, at least a part of the region connected with the semiconductor layer is overlapped with the gate electrode 2. Here, in the source electrode 6a and the drain electrode 6b, at least a part of the region contacting the conductive impurity semiconductor film 5 is overlapped with the gate electrode 2. Note that as for a planar type disclosed in Japanese Unexamined Patent Application Publication No. 60-136259, 61-46069, 7-78997 and 2004-363626, an upper insulating film is formed over a semiconductor layer and a source electrode and a drain electrode are respectively connected with the semiconductor layer through a contact hole formed in the upper insulating film. Then, the portion to which the source electrode and the drain electrode are respectively connected with the semiconductor layer, that is, the portion of the contact hole, is ensured not to overlap with the gate electrode. This is for preventing from connecting with the gate electrode when the opening of the contact hole penetrates the semiconductor layer. The TFT 108 is formed by the gate electrode 2, the semiconductor film 4, the conductive impurity semiconductor film 5, the source electrode 6a and the drain electrode 6b, etc.

Further, a first upper insulating film 7 and a second upper insulating film 8 are sequentially formed to cover the channel region 4b, the source electrode 6a and the drain electrode 6b. As described above, the conductive impurity semiconductor film 5, the source electrode 6a and the drain electrode 6b are not formed over channel region 4b. Therefore, the first upper insulating film 7 is directly in contact with the channel region 4b of the semiconductor film 4. Further, the first upper insulating film 7 and the second upper insulating film 8 are also in contact. Here, the first upper insulating film 7, which is a first protective film, discharges moisture by heat treatment. The first upper insulating film 7 is desirably formed by Plasma Enhanced Chemical Vapor Deposition (CVD) using TEOS (Tetra Ethyl Ortho Silicate) as material gas. Moreover, in order to reduce surface roughness of the channel regions 4b, the first upper insulating film 7 desirably includes at least one of an organic SOG material, an organic SOD material, an inorganic SOG material and an inorganic SOD material. Further, the second upper insulating film 8, which is a second protective film, is a cap film for suppressing moisture out-diffusion. A silicon oxide film can be used for the first upper insulating film 7 and a film including a silicon nitride film can be used for the second upper insulating film 8. Then, as shown in FIG. 4, a contact hole 10 is formed in the first upper insulating film 7 and the second upper insulating film 8 over the drain electrode 6b. The pixel electrode 9 is formed almost all over except for the TFT 108 in one pixel. Then, the pixel electrode 9 is conductive with the drain electrode 6b by the contact hole 10.

The TFT 108 and the TFT array substrate 100 are formed as mentioned above. In this embodiment, the first upper insulating film 7 and the second upper insulating film 8 are sequentially formed in contact with the channel region 4b. The first upper insulating film 7 is a film which discharges moisture by heat treatment. Then, the second upper insulating film 8 is a cap film for suppressing moisture out-diffusion. Accordingly, by a heat treatment, moisture is diffused in the silicon of the semiconductor film 4 to reconstruct the dangling bond in the silicon. As the cap film covers the first upper insulating film 7 at this time, the moisture included in the first upper insulating film 7 is fully diffused under the second upper insulating film 8 without being diffused over the second upper insulating film 8. That is, moisture can be efficiently diffused in the silicon of the semiconductor film 4. Further, an electrical property with large carrier mobility (μeff) and large on current can be realized. That is, the TFT 108 with high drive reliability and good TFT characteristics can be obtained. Therefore, display devices such as a liquid crystal display device using the TFT 108 of this embodiment will have a good display property.

Next, the manufacturing method of the TFT 108 according to this embodiment is explained with reference to FIGS. 5A to 5D. FIGS. 5A to 5D are schematic cross-sectional diagrams showing the manufacturing method of the TFT 108.

Firstly, a metal thin film is formed by sputtering etc. over the insulating substrate 1. The metal thin film is for example Cr, Al, Ti or an alloy mainly containing thereof or a stacked layer of these metals. Then, a resist which is a photosensitive resin is applied by a spin coating over the metal thin film. Then, the applied resist is exposed through a photomask. Next, the exposed resist is developed and the resist is patterned. Such a process is called photolithography process. After that, the metal thin film is etched using the resist pattern as a mask to remove the resist pattern. Hereafter, the series of processes, which are the photolithography process and the etching process, are referred to as photoetching. The metal thin film is patterned in a desired shape by the photoetching and the gate electrode 2 and the gate signal line, etc. are formed.

Figure 5A:
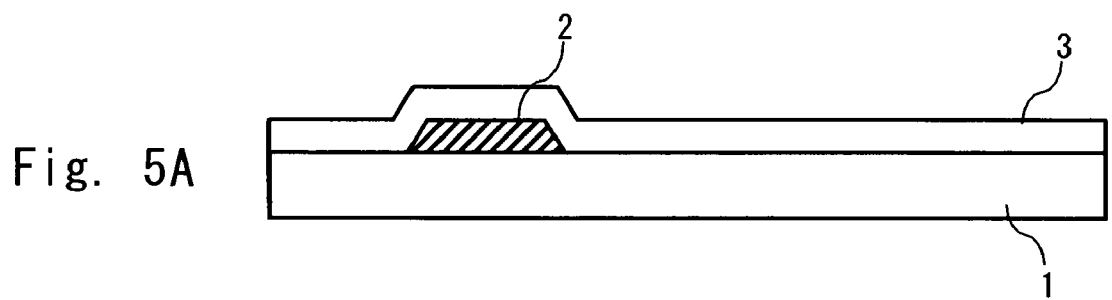
FIGS. 5A to 5D are schematic cross-sectional diagrams showing the manufacturing method of the TFT according to the first embodiment.

Next, the gate insulating film 3 is formed with various CVD such as plasma CVD over the gate electrode 2 and the insulating substrate 1. Moreover, in order to increase the gate breakdown voltage, it is necessary to increase the film thickness of the gate insulating film 3. However, increasing the film thickness of the gate insulating film 3 causes to reduce gate capacitance and on current of a TFT 108. Therefore, the gate insulating film 3 needs to increase the film thickness and increase the gate breakdown voltage. Additionally, the gate insulating film 3 needs to increase dielectric constant and restrain the fall of gate capacitance. As for the gate insulating film 3, it is desirable to use a silicon nitride film with the most appropriate thickness in accordance with the drive condition of the TFT 108. From the above process, as shown in FIG. 5A, the gate electrode 2 and the gate insulating film 3 are formed over the insulating substrate 1.

The semiconductor film 4 and the conductive impurity semiconductor film 5 are sequentially formed with various CVD such as plasma CVD over the gate insulating film 3. Here, the semiconductor film 4 is pure semiconductor with no impurities added, that is, an intrinsic semiconductor. As for the semiconductor film 4, a-Si (amorphous silicon) is used. As the conductive impurity semiconductor film 5, $n^+$a-Si ($n^+$ amorphous silicon) film etc. are used. $n^+$a-Si ($n^+$ amorphous silicon) film is an n-type semiconductor and doped with a small amount of P (phosphorus) etc. to a-Si. The semiconductor film 4 and the conductive impurity semiconductor film 5 are desirably formed in the same chamber. It is needless to say that the gate insulating film 3 formed in the above process can be formed in the same chamber. Then the electric connection resistance between the semiconductor film 4 and the conductive impurity semiconductor film 5, which is between two kinds of silicon layers, is reduced. This semiconductor film 4 and the conductive impurity semiconductor film 5 are photoetched in a predetermined shape. More specifically, the semiconductor film 4 and the conductive impurity semiconductor film 5 are formed to be an island shape over the gate electrode 2.

Figure 5B:
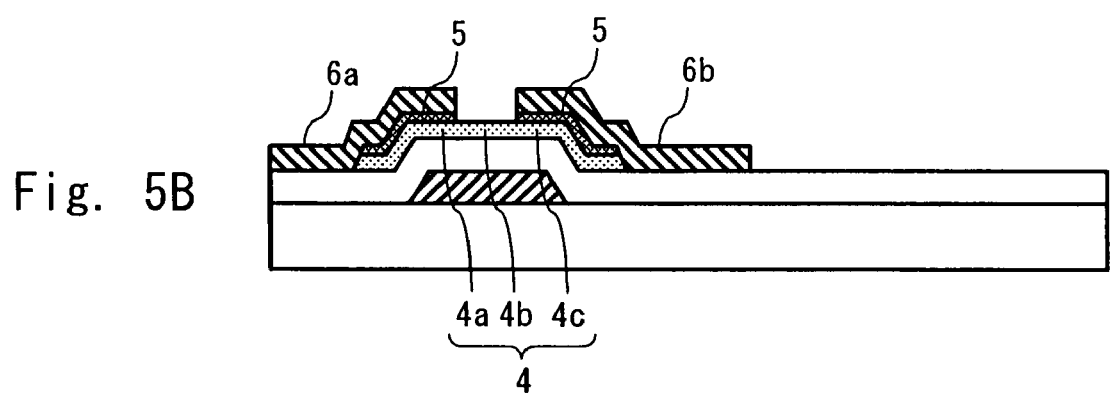

Next, a metal thin film is formed by sputtering etc. over the conductive impurity semiconductor film 5. The metal thin film is for example Al, Mo, Cr or an alloy mainly containing thereof or a stacked layer of these metals. Then, the formed metal thin film is photoetched in a desired shape. At this time, the central part of the metal thin film over the gate electrode 2 is removed. Therefore, the metal thin film is formed to the both ends of the conductive impurity semiconductor film 5. One of the metal thin films formed to the both ends is to be the source electrode 6a and the other is to be the drain electrode 6b. Then, the conductive impurity semiconductor film 5 is etched using the patterns of the source electrode 6a and the drain electrode 6b as a mask. This process removes the central part of the conductive impurity semiconductor film 5 and exposes the semiconductor film 4. In the semiconductor film 4, the region where this conductive impurity semiconductor film 5 is removed is the channel region 4b. Then, the region of the semiconductor film 4 corresponding to the source electrode 6a is to be the source region 4a and the region of the semiconductor film 4 corresponding to the drain electrode 6b is to be the drain region 4c. That is, the source region 4a and the drain region 4c are formed to the both sides of the channel region 4b. The structure shown in FIG. 5B is formed over the substrate by the abovementioned processes.

After that, the upper insulating film 7 is formed with various CVD such as plasma CVD so that the gate insulating film 3, the channel region 4b, the source electrode 6a and the drain electrode 6b are covered. The first upper insulating film 7 shall discharge moisture by heat treatment performed later. The first upper insulating film 7 is desirably formed by plasma CVD using TEOS (Tetra Ethyl Ortho Silicate) with high hydrogen concentration as material gas. Note that since the silicon oxide film formed by the reaction of TEOS and oxygen ($O_2$) is excellent in step coverage, thus it is suitable for the first upper insulating film 7. The step coverage here is in the covering state of a step part. Moreover, in order to reduce the surface roughness of the source electrode 6a and the conductive impurity semiconductor film 5, and the drain electrode 6b and the conductive impurity semiconductor film 5, which is created by the formation of the channel region 4b, an inorganic SOG (or SOD) material or an organic SOG (or SOD) material is desirably coated over the CVD-TEOS oxide film (the first upper insulating film 7) or directly on the channel region 4b. That is, the first upper insulating film 7 desirably includes at least one of an organic SOG material, an organic SOD material, an inorganic SOG material and an inorganic SOD material. This enables to suppress from generating a crack at the time of forming the second upper insulating film 8, which is formed over the first upper insulating film 7 later. Then, fugacity of hydrogen or oxygen at the time of heat treatment (hydrogen treatment or oxidation treatment) is suppressed, and uniformity of a TFT characteristic is improved.

As the inorganic SOG (or SOD) material, a hydrogen silsesquioxane (HSQ) is desirable. As the HSQ, there are FOx-12-15 (manufactured by Dow Corning Toray Co., Ltd.), and OCDT-12 and OCDT-32 (manufactured Tokyo Ohka Kogyo Co., Ltd.). As the organic SOG (or SOD) material, methyl silsesquioxane (MSQ) is desirable. As the material of this MSQ, there are OCDT-9, OCDT-39 (manufactured by Tokyo Ohka Kogyo Co., Ltd.) and HSG-R7 and HSG-RZ25 (manufactured by Hitachi Chemical Co., Ltd.).

Next, the second upper insulating film 8 is formed to cover the first upper insulating film 7 by various CVD such as plasma CVD. The second upper insulating film 8 shall be able to suppress moisture out-diffusion. As the second upper insulating film 8, a silicon nitride film which can be formed by plasma CVD is desirable. The plasma CVD is explained here. In the plasma CVD, plasma of the gas containing material molecules is generated and material molecules are dissociated by the electrons accelerated in the plasma. Thus, in the plasma, material molecules are dissociated and a chemical reaction (radical reaction) is promoted, thereby enabling to form films at a lower temperature (250 to 400 degrees Celsius) as compared with low pressure CVD. Accordingly, it is suitable for forming protective films (passivation) such as an upper insulating film. Moreover, in the plasma CVD, since a film can be formed at low temperature of 300 degrees Celsius or below, a protective film can be formed after forming an Al film. With the low pressure CVD, a silicon nitride film can be formed at about 650 to 800 degrees Celsius and a silicon oxide film can be formed at about 650 to 750 degrees Celsius. However by plasma CVD, they can be formed at about 250 to 400 degrees Celsius. Radio frequency (RF) discharge is used in the plasma CVD. Moreover, the pressure used in the plasma CVD is about 30 to 500 Pa in gas pressure and generally a Baratron manometer is used as a manometer for pressure control.

Figure 5C:
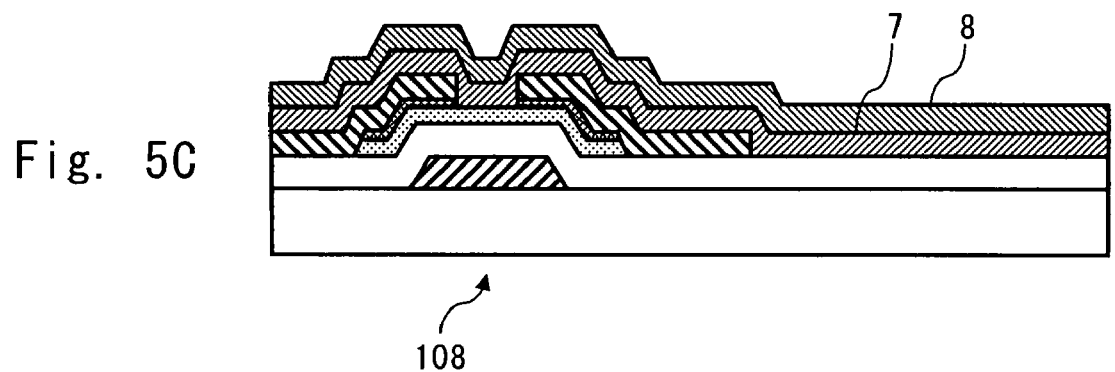

Moreover, as indicated in Jpn. J. Appl. Phys., Vol. 32 (1993) pp. 1787-1793 (N. Hirashita, S. Tokitoh and H. Uchida) a silicon oxide film (TEOS oxide film) made from TEOS discharges moisture. In order to suppress the moisture from discharging over the second upper insulating film 8, it is desirable to form the second upper insulating film 8 densely at 350 degrees Celsius or below. Incidentally, as mentioned above, the plasma CVD is suitable as the film can be formed at a lower temperature than the low pressure CVD. Moreover, a nitride film by the plasma CVD is suitable for the second upper insulating film 8 as it is excellent in density of film quality, blockability to alkaline ion such as Na ion, mechanical strength and step coverage. A heat treatment is applied with the second upper insulating film 8 as a cap film after forming the second upper insulating film 8. By this heat treatment, moisture is discharged from the first upper insulating film 7 and this moisture is diffused in the semiconductor film 4, thereby reducing the dangling bond in the silicon of the semiconductor film 4 and the interface. Although this heat treatment can be performed at 200 to 600 degrees Celsius, it is especially desirable to perform at 200 to 350 degrees Celsius, considering moisture discharge temperature of TEOS oxide film as disclosed in Jpn. J. Appl. Phys., Vol. 32 (1993) pp. 1787-1793 (N. Hirashita, S. Tokitoh and H. Uchida). This is because that moisture diffusion is insufficient at 200 degrees Celsius or below, whereas Si—H bond of amorphous silicon is easily cut at high temperature. Moreover, if HSQ or MSQ is included in the first upper insulating film 7, cautions are required for thermal decomposition. Especially for HSQ, the heat treatment temperature is desirably 400 degrees Celsius or below. On the other hand, for LTPS-TFT as in Japanese Unexamined Patent Application Publication No. 2004-363626, a high temperature heat treatment is required for crystallized silicon as compared to a-Si TFT of this embodiment. The TFT 108 is formed over the substrate as shown in FIG. 5C from the above processes.

Figure 5D:
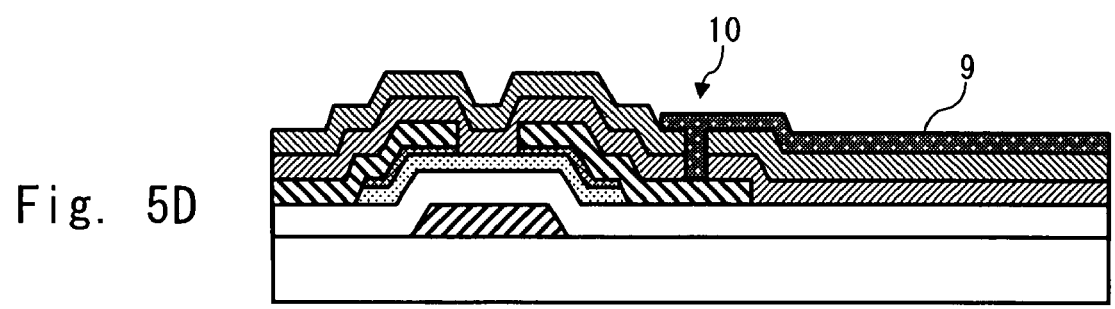

After the heat treatment, the contact hole 10 is opened by photoetching in a predetermined portion of the second upper insulating film 8 and the first upper insulating film 7 underneath. This removes a part of the second upper insulating film 8 and the first upper insulating film 7 formed over the drain electrode 6b and the drain electrode 6b is exposed. Then, a conductive material is formed by sputtering etc. and photoetched in a predetermined shape. Then, the pixel electrode 9 is formed almost all over except the TFT 108 in one pixel. Note that the pixel electrode 9 is also filled up in the contact hole 10 to be conductive with the drain electrode 6b. Accordingly, the pixel electrode 9 is electrically connected with the drain electrode 6b through the contact hole 10. The TFT array substrate 100 is manufactured as shown in FIG. 5D from the above processes.

An alignment layer such as polyimide is applied to the surface of the above TFT array substrate 100 and the opposing substrate 122 in which the opposing electrode 126, the color filter layer 125 or the like is formed. Then, after performing an alignment process, the sealing agent 123 is applied to both substrates 100 and 122 to bond them together. Next, after filling a liquid crystal in an empty cell and forming the liquid crystal layer 124, the liquid crystal cell is sealed by an end-sealing agent. Then, the polarizing plate 127 etc. are bonded to the liquid crystal cell to form the liquid crystal panel 120. The liquid crystal display device 128 is manufactured by mounting a driving circuit to the liquid crystal panel 120 and disposing the backlight unit 121.

As described above, according to the manufactured TFT 108 and the liquid crystal display device 128, the first upper insulating film 7 and the second upper insulating film 8 are sequentially formed to cover the channel region 4b. The first upper insulating film 7 is a film for discharging moisture by heat treatment. Further, the second upper insulating film 8 is a cap film for suppressing moisture out-diffusion. By applying a heat treatment after forming the first upper insulating film 7 and the second upper insulating film 8, moisture is diffused in the silicon of the semiconductor film 4 to reconstruct the dangling bond in the silicon. Then, an electrical property with large carrier mobility ($\mu$eff) and large on current can be realized. That is, the TFT 108 with high drive reliability and good TFT characteristics can be obtained. Therefore, the manufacturing method of the display device according to this embodiment achieves a good display property.

Generally, many Si—H bonds existing in silicon exist especially in a-Si. This Si—H bond tends to dissociate hydrogen (H) by heat treatment etc., thereby increasing dangling bond in the silicon. That is, the present invention is most effective when applied to a-Si TFT. Accordingly in this embodiment, a-Si TFT using a-Si for the semiconductor film 4 is explained, but it is not limited to this. For example, it may be a polysilicon (p-Si) TFT, a micro crystal silicon TFT and a TFT combining these TFTs (combining a-Si and micro crystal silicon TFT or the like). Moreover, it may be an etch stopper (ES) type TFT but CE type TFT is more preferable. This is because that unlike ES type TFT, CE type TFT does not need to form an etching stopper over the channel region of the semiconductor film and can form the first upper insulating film as the first protective film directly on the channel region. Therefore, with CE type TFT, moisture fully reaches to the semiconductor film unlike ES type TFT in which an etching stopper is an interference. Furthermore, the heat treatment for diffusing moisture may relatively be low temperature and the heat treatment time can be performed in a short time. Moreover, as CE type TFT does not need to form an etching stopper unlike the ES type TFT, the process to form an insulating material film to be the etching stopper, photolithography process, etching process or the like to form the etching stopper are not necessary, thereby achieving the effect of cost reduction.

Second Embodiment

Figure 6:
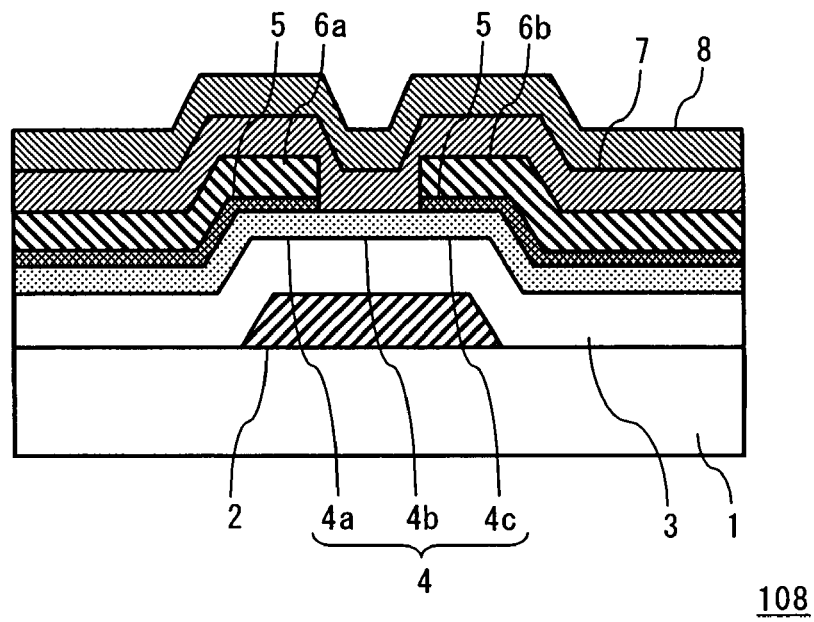
FIG. 6 is a schematic cross-sectional diagram showing the configuration of a TFT according to a second embodiment.
Figure 7:
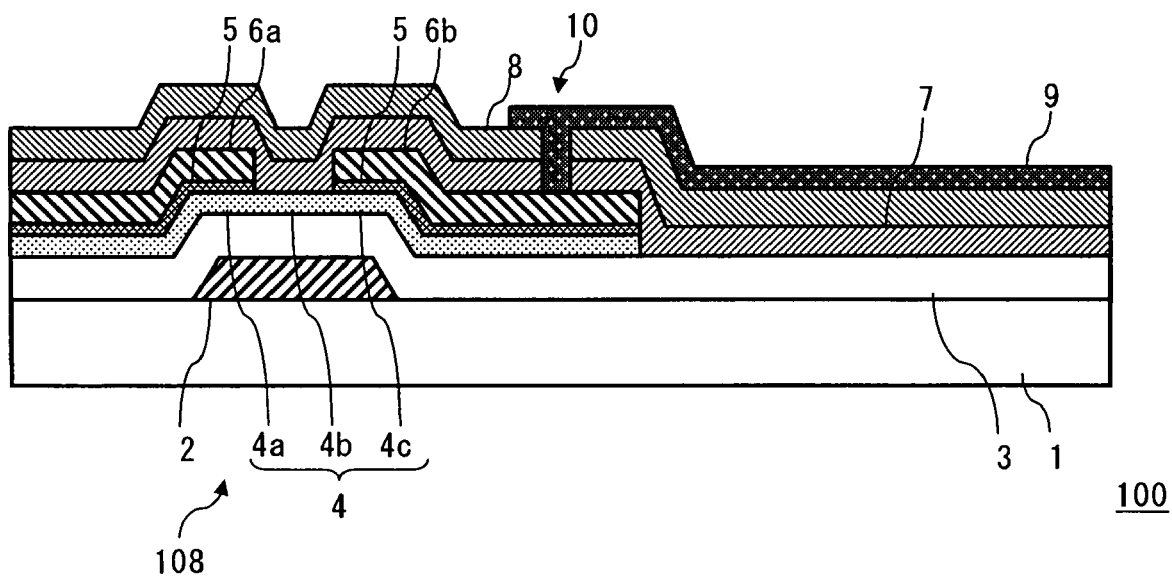
FIG. 7 is a schematic cross-sectional diagram showing the configuration of a TFT array substrate at one pixel according to the second embodiment.

A TFT 108 according to this embodiment is explained with reference to FIGS. 6 and 7. FIG. 6 is a schematic cross-sectional diagram showing the configuration of the TFT 108. FIG. 7 is a schematic cross-sectional diagram showing the configuration of the TFT array substrate 100 at one pixel. Note that the same numbers represent the same layer in the drawings. This embodiment is identical to the first embodiment except for the shapes of the semiconductor film 4 and the conductive impurity semiconductor film 5.

In this embodiment, the conductive impurity semiconductor film 5 is formed in the entire lower regions of the source electrode 6a and the drain electrode 6b. Then, the semiconductor film 4 formed in the lower layer of the conductive impurity semiconductor film 5 is formed also to the entire lower regions of the source electrode 6a and the drain electrode 6b and between the source electrode 6a and the drain electrode 6b. This is because of the order of shape processing of the semiconductor film 4, the conductive impurity semiconductor film 5, the source electrode 6a and the drain electrode 6b.

As mentioned above, in the first embodiment, after patterning the semiconductor film 4 and the conductive impurity semiconductor film 5, the source electrode 6a and the drain electrode 6b are patterned. On the other hand, in this embodiment, after patterning the source electrode 6a and the drain electrode 6b, the semiconductor film 4 and the conductive impurity semiconductor film 5 are patterned. Moreover, by using a multi-gradation mask at the time of patterning by photoetching, a transfer process for exposing the resist is eliminated and thus the productivity improves. There are gray-tone masks and half-tone masks for multi-gradation masks. The gray-tone mask is created a slit below the resolution of a lithography equipment and the slit portion blocks a part of light to be middle exposure. On the other hand, the half-tone mask uses a semi-transparent film to perform middle exposure. Therefore, three exposure levels of an exposure portion, a middle exposure portion and an unexposed portion can be realized with either mask. Then, the resist is exposed through the mask. Then, the resist pattern of two kinds of thickness can be formed by developing the exposed resist. As for the resist pattern here, the film thickness of the resist pattern over the channel region 4b is thin. Then, by etching with this resist pattern as a mask, the semiconductor film 4, the conductive impurity semiconductor film 5, the source electrode 6a and the drain electrode 6b can be patterned. Incidentally, the processes except for the above process are identical to the first embodiment. Also in this embodiment, the same effect as the first embodiment can be achieved.

Third Embodiment

Figure 8:
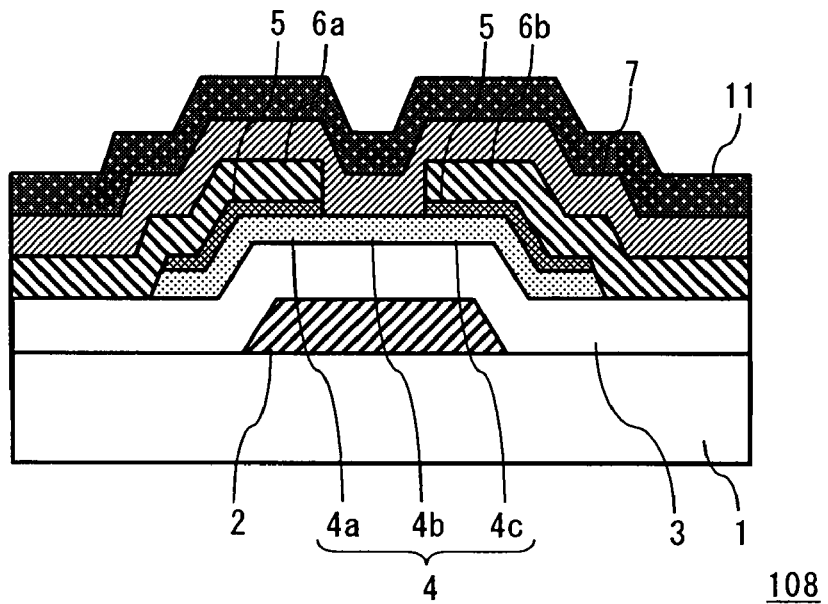
FIG. 8 is a schematic cross-sectional diagram showing the configuration of a TFT according to a third embodiment.
Figure 9:
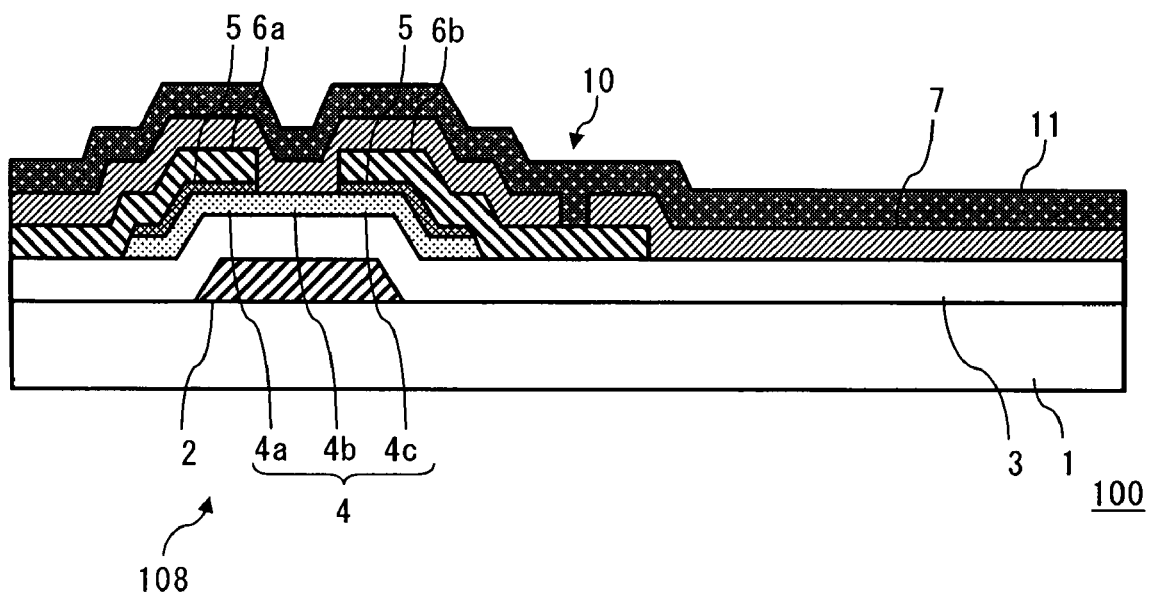
FIG. 9 is a schematic cross-sectional diagram showing the configuration of a TFT array substrate at one pixel according to the third embodiment.

A TFT 108 according to this embodiment is explained with reference to FIGS. 8 and 9. FIG. 8 is a schematic cross-sectional diagram showing the configuration of the TFT 108. FIG. 9 is a schematic cross-sectional diagram showing the configuration of the TFT array substrate 100 at one pixel. Note that the same numbers represent the same layer in the drawings. This embodiment is identical to the first embodiment except for the second upper insulating film 8 and the pixel electrode 9.

In this embodiment, a conductive film 11 is used instead of the second upper insulating film 8. That is, the conductive film 11, which is a second protective film, is formed over the first upper insulating film 7. Moreover, the contact hole 10 is formed in the first upper insulating film 7 over the drain electrode 6b. Then the drain electrode 6b and the conductive film 11 are connected and become conductive. Moreover, in the case of the TFT array substrate 100 used for a display device such as the liquid crystal display device 128 as shown in FIG. 9, the conductive film 11 can be used as the pixel electrode 9. The conductive film 11 can suppress moisture out-diffusion.

Next, the manufacturing method of the TFT array substrate 100 is explained with reference to FIGS. 10A to 10D. FIGS. 10A to 10D are schematic cross-sectional diagrams showing the manufacturing method of the TFT array substrate 100.

Figure 10A:
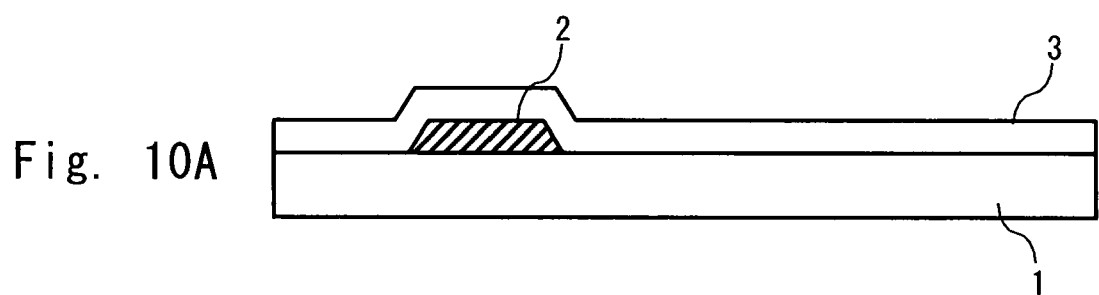
FIGS. 10A to 10D are schematic cross-sectional diagrams showing the manufacturing method of the TFT according to the third embodiment.
Figure 10B:
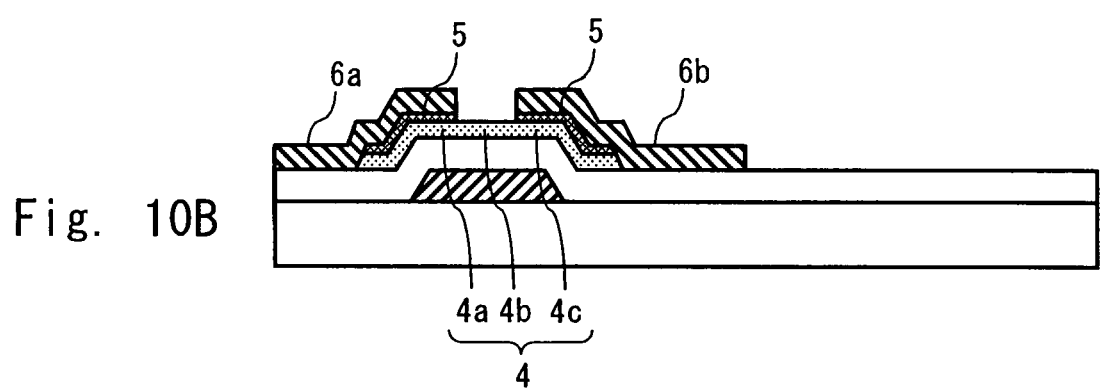
Figure 10C:
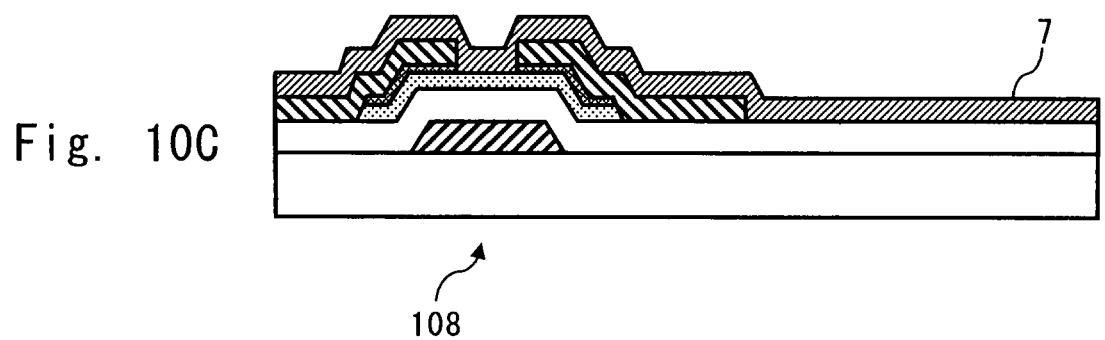
Figure 10D:
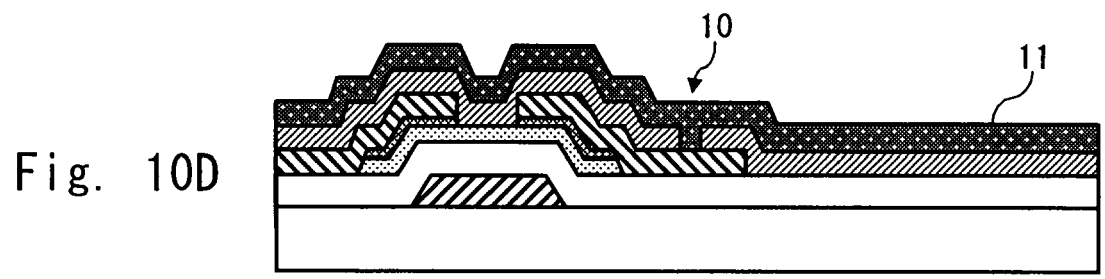

Firstly, as shown in FIG. 10A, the gate electrode 2 and the gate insulating film 3 are formed over the insulating substrate 1. Then, as shown in FIG. 10B, the semiconductor film 4, the conductive impurity semiconductor film 5, the source electrode 6a and the drain electrode 6b are formed. Next, the first upper insulating film 7 is formed to cover these. Then, as shown in FIG. 10C, the TFT 108 is formed over the substrate. Note that the processes so far are performed in the same way as the first embodiment. Next, the contact hole 10 is opened to the first upper insulating film 7 by photoetching in a predetermined portion. This removes a part of the first upper insulating film 7 formed over the drain electrode 6b and the drain electrode 6b is exposed. Then, the conductive film 11 is formed by sputtering etc. over the first upper insulating film 7 and processed in a specified shape by photoetching. Here, the conductive film 11 is formed almost all over including the TFT 108 at one pixel. Note that the conductive film 11 is also filled up in the contact hole 10 to be conductive with the drain electrode 6b. Accordingly, the conductive film 11 is electrically connected with the drain electrode 6b through the contact hole 10. The conductive film 11 is required to suppress moisture out-diffusion. The conductive film 11 is desirably formed by a film including at least one of Al, Ti, Ta, W, Mo, TiN, TaN, MoN, ZrN, VN, HfN, NbN, TiZrN, ZrVN, ITO, IZO, ITZO and ZnO. As shown in FIG. 1, if the liquid crystal display device 128 is a transmissive type, a transparent electrode is required for the conductive film 11. For the conductive film 11 in such case, ITO, IZO, ITZO and ZnO are desirable. Moreover, if the liquid crystal display device 128 is a reflective type, a single layer film or a multilayer film which uses Al with high reflection factor at least to the surface is desirable. Then, a heat treatment is applied with the conductive film 11 as a cap film. Note that the heat treatment here is performed in the same way as the second upper insulating film 8 of the first embodiment. The TFT array substrate 100 is manufactured as shown in FIG. 10D from the above processes. The liquid crystal display device 128 can be manufactured using this TFT array substrate 100 as in the first embodiment.

According to the TFT 108 and the liquid crystal display device 128 of this embodiment, the conductive film 11 can be used as the second upper insulating film 8 and the pixel electrode 9. This rationalizes and simplifies the manufacturing process and improves the productivity. The same effect as the first embodiment can also be achieved in this embodiment.

Fourth Embodiment

Figure 11:
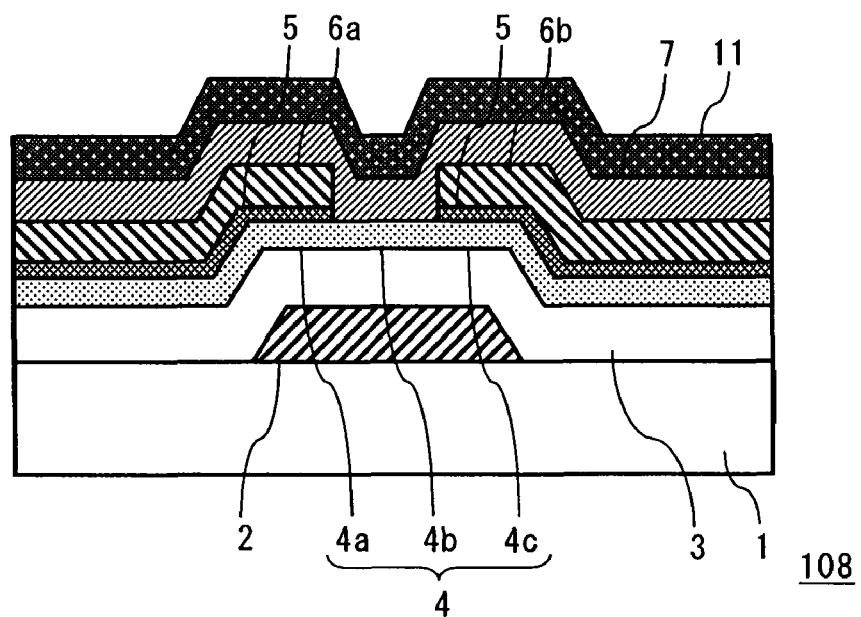
FIG. 11 is a schematic cross-sectional diagram showing the configuration of a TFT according to a fourth embodiment.
Figure 12:
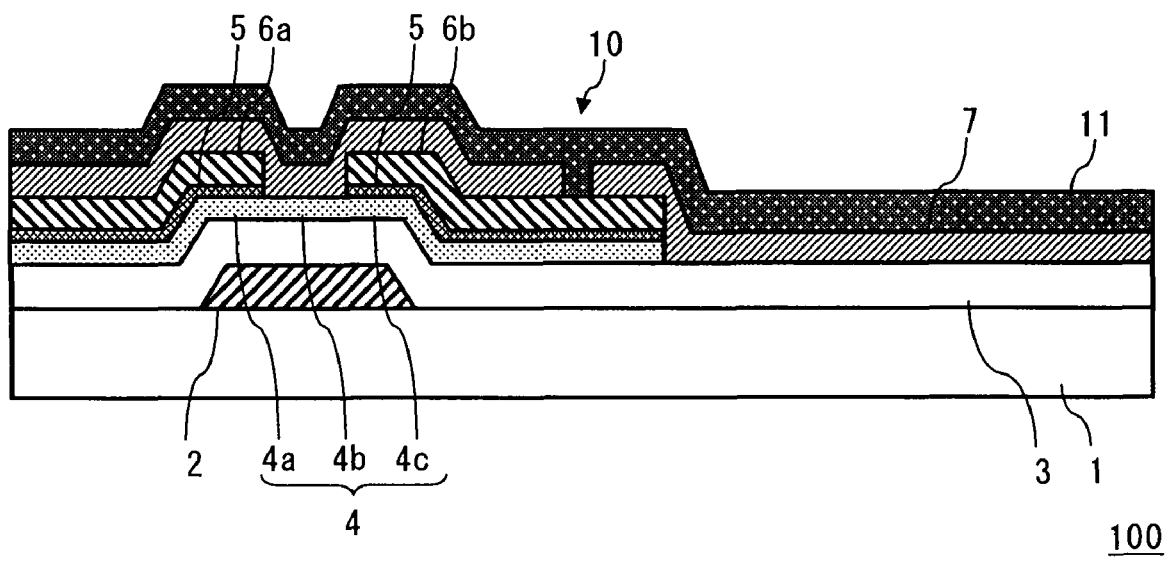
FIG. 12 is a schematic cross-sectional diagram showing the configuration of a TFT array substrate at one pixel according to the fourth embodiment.

A TFT according to this embodiment is explained with reference to FIGS. 11 and 12. FIG. 11 is a schematic cross-sectional diagram showing the configuration of the TFT 108. FIG. 12 is a schematic cross-sectional diagram showing the configuration of the TFT array substrate 100 at one pixel. Note that the same numbers represent the same layer in the drawings. This embodiment is identical to the third embodiment except for the shapes of the semiconductor film 4 and the conductive impurity semiconductor film 5.

The conductive impurity semiconductor film 5 is formed to the entire lower regions of the source electrode 6a and the drain electrode 6b. Then, the semiconductor film 4 formed in the lower layer of the conductive impurity semiconductor film 5 is also formed in the entire lower regions of the source electrode 6a and the drain electrode 6b and between the source electrode 6a and the drain electrode 6b. This is because of the order of shape processing of the semiconductor film 4 and the conductive impurity semiconductor film 5.

As mentioned above, in the third embodiment, the source electrode 6a and the drain electrode 6b are patterned after patterning the semiconductor film 4 and the conductive impurity semiconductor film 5. On the other hand, in this embodiment, the semiconductor film 4 and the conductive impurity semiconductor film 5 are patterned after patterning the source electrode 6a and the drain electrode 6b. Moreover, by using a multi-gradation mask at the time of patterning by photoetching, a transfer process for exposing the resist is eliminated and thus the productivity improves. Note that the semiconductor film 4, the conductive impurity semiconductor film 5, the source electrode 6a and the drain electrode 6b are formed in the same way as the second embodiment. Incidentally, the processes except for the above process are identical to the third embodiment. Also in this embodiment, the same effect as the second embodiment and the third embodiment can be achieved.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A thin film transistor comprising:
a gate electrode;
a gate insulating film formed to cover the gate electrode;
a semiconductor layer formed over the gate electrode with the gate insulating film interposed therebetween, the semiconductor layer including a channel region;
a source electrode and a drain electrode each including a region connected to the semiconductor layer, at least a part of each region being overlapped with the gate electrode;
a source electrode and a drain electrode each including a region connected to the semiconductor layer, at least a part of each region of the source and drain electrodes being overlapped with the gate electrode; a first protective film formed to cover the semiconductor layer, the source electrode and the drain electrode, the first protective film including at least one of an organic SOG (spin-on-glass) material, an organic SOD (spin-on-dielectric) material, an inorganic SOG material and an inorganic SOD material, the organic SOD material, the inorganic SOG material, and the inorganic SOD material is directly in contact with the channel region of the semiconductor layer and discharges moisture by heat treatment
a second protective film formed to cover the first protective film and suppress moisture out-diffusion.

2. The thin film transistor according to claim 1, wherein the second protective film is formed by a film including a silicon nitride film.

3. The thin film transistor according to claim 1, wherein the second protective film is a conductive film and the conductive film is formed by a film including at least one of Al, Ti, Ta, W, Mo, TiN, TaN, MoN, ZrN, VN, HfN, NbN, TiZrN, ZrVN, ITO, IZO, ITZO and ZnO.

4. A display device including the thin film transistor according to claim 3, wherein,
the thin film transistor further includes a contact hole formed in the first protective film over the drain electrode, and
the conductive film is connected with the drain electrode through the contact hole.

5. A display device including the thin film transistor according to claim 1.

6. The thin film transistor according to claim 1, wherein the semiconductor layer includes a semiconductor film on the source electrode side and the drain electrode side.

7. The thin film transistor according to claim 6, wherein the semiconductor film is a conductive impurity semiconductor film.

* * * * *